United States Patent
Zhan et al.

(10) Patent No.: US 10,233,075 B2
(45) Date of Patent: Mar. 19, 2019

(54) METHOD FOR FORMING FILTER NET ON MEMS SENSOR AND MEMS SENSOR

(71) Applicant: Goertek Inc., Shandong (CN)

(72) Inventors: Junkai Zhan, Shandong (CN); Zonglin Zhou, Shandong (CN); Guanxun Qiu, Shandong (CN); Mengjin Cai, Shandong (CN)

(73) Assignee: Goertek Inc., Shandong (CN)

( * ) Notice: Subject to any disclaimer, the term of this patent is extended or adjusted under 35 U.S.C. 154(b) by 0 days.

(21) Appl. No.: 15/739,913

(22) PCT Filed: Mar. 3, 2017

(86) PCT No.: PCT/CN2017/075595
§ 371 (c)(1),
(2) Date: Dec. 26, 2017

(87) PCT Pub. No.: WO2018/094905
PCT Pub. Date: May 31, 2018

(65) Prior Publication Data
US 2018/0362331 A1    Dec. 20, 2018

(30) Foreign Application Priority Data
Nov. 22, 2016  (CN) .......................... 2016 1 1041741

(51) Int. Cl.
*B81B 7/00* (2006.01)
*B81C 1/00* (2006.01)
*B81C 3/00* (2006.01)

(52) U.S. Cl.
CPC ........ *B81B 7/0058* (2013.01); *B81C 1/00261* (2013.01); *B81C 3/001* (2013.01); *B81B 2201/02* (2013.01)

(58) Field of Classification Search
CPC ..... B81B 7/0058; B81B 2201/02; B81B 7/00; B81C 1/00261; B81C 3/001; B81C 1/00
(Continued)

(56) References Cited

U.S. PATENT DOCUMENTS 6,955,900 B1 * 10/2005 Barbas, III ............. C07H 21/00
435/69.1
2009/0068594 A1 * 3/2009 Shimbori .............. G03F 7/0392
430/286.1
(Continued)

FOREIGN PATENT DOCUMENTS

CN      202957950 U    5/2013
CN      106044698 A    10/2016
(Continued)

OTHER PUBLICATIONS

International Search Report and Written Opinion from International Application No. PCT/CN2017/075595, dated Jun. 30, 2017, 11 pages.

*Primary Examiner* — Alexander O Williams
(74) *Attorney, Agent, or Firm* — Alston & Bird LLP

(57) ABSTRACT

A method for forming a filter net on an MEMS sensor and an MEMS sensor are disclosed. The method comprises the following steps: disposing a dissociable adhesive tape on a base material, and forming a filter net on an adhesive surface of the dissociable adhesive tape; transferring the filter net on a film to form a self-adhesive coiled material; and transferring and adhering the filter net on the self-adhesive coiled material to collecting a hole of the MEMS sensor. The filter net formed by the method have fine and uniform meshes, and a yield is high. In addition, the method is suitable for large-scale and industrialized production.

10 Claims, 4 Drawing Sheets

(58) Field of Classification Search
USPC .......................................................... 257/414
See application file for complete search history.

(56) References Cited

U.S. PATENT DOCUMENTS

| | | | |
|---|---|---|---|
| 2010/0224437 A1* | 9/2010 | Booth ...................... | H04R 7/10 |
| | | | 181/166 |
| 2012/0225448 A1* | 9/2012 | Sugiyama .............. | C12M 47/04 |
| | | | 435/29 |
| 2014/0002964 A1 | 1/2014 | Li et al. | |
| 2016/0305837 A1 | 10/2016 | Froemel | |
| 2016/0347896 A1* | 12/2016 | Tanaka ................. | C07D 307/33 |

FOREIGN PATENT DOCUMENTS

| | | | | |
|---|---|---|---|---|
| CN | 106744664 A | * | 5/2017 | .............. B81C 3/00 |
| JP | 2004-349416 A | | 12/2004 | |
| WO | 2018094905 A1 | * | 5/2017 | .............. H04R 1/02 |

\* cited by examiner

METHOD FOR FORMING FILTER NET ON MEMS SENSOR AND MEMS SENSOR

CROSS-REFERENCE TO RELATED APPLICATIONS

This application is a National Stage Application, filed under 35 U.S.C. § 371, of International Application No. PCT/CN2017/075595, filed on Mar. 3, 2017, which international application claims priority to Chinese Patent Application No. 201611041741.X, filed on Nov. 22, 2016, the contents of both of which as are hereby incorporated by reference in their entireties.

BACKGROUND

Related Field

The present invention relates to the technical field of micro electro-mechanical systems (MEMS), and more particularly, relates to a method for forming a filter net on an MEMS sensor and an MEMS sensor provided with a filter net formed according to such a method.

Description of Related Art

With technological progress, thinner and miniaturized consumer electronic products have become current developing trends. A problem about environmental adaptability needs to be considered when all electronic products that are in contact with the outside are designed and developed. Dust proofing and water proofing of the electronic products have attracted more and more attention of people.

An MEMS device generally comprises a packaging structure and an MEMS chip disposed in the packaging structure. The packaging structure has through holes, such that the MEMS chip can collect all kinds of information of an external environment, for example, vibration, light, temperature, humidity, air pressure, etc. However, due to the through holes of the MEMS device of such a structure, water and dust can easily enter the packaging structure in use. Generally, the purposes of dust proofing and water proofing are achieved by disposing a filter net on the collecting holes.

However, as the MEMS sensing devices are miniaturized, the designs of water proofing and dust proofing are becoming more and more difficult. Besides, the existing dustproof and waterproof processes specific to MEMS sensors are very complicated, high in cost and poor in universality, and have poor dustproof and waterproof effects. The production requirements of miniaturized sensors cannot be met.

BRIEF SUMMARY

An object of the present invention is to provide a new technical solution of a method for forming a filter net on an MEMS sensor.

According to a first aspect of the present invention, there is provided a method for forming a filter net on an MEMS sensor. The method comprises the following steps:

disposing a dissociable adhesive tape on a base material, and forming a filter net on an adhesive surface of the dissociable adhesive tape;

transferring the filter net on a film to form a self-adhesive coiled material; and transferring and adhering the filter net on the self-adhesive coiled material to collecting holes of the MEMS sensor.

Optionally, meshes of the filter net are formed by adopting a photolithography method or nano-impressing method.

Optionally, the step of forming the filter net comprises:

disposing a photoresist on the adhesive surface of the dissociable adhesive tape;

adopting the photolithography method to etch the photoresist to form a first hollowed-out pattern matched with a framework of the filter net;

depositing a structural material in the first hollowed-out pattern; and removing the photoresist to form the filter net.

Optionally, the step of forming the filter net comprises:

depositing a structural material on the adhesive surface of the dissociable adhesive tape;

disposing a photoresist on the surface of the structural material;

adopting the photolithography method to etch the photoresist to form a second hollowed-out pattern matched with the meshes of the filter net;

etching the structural material according to the second hollowed-out pattern to form the mesh holes; and removing the photoresist to form the filter net.

Optionally, the structural material forming the filter net is metal, ceramic or a high polymer material.

Optionally, the structural material is deposited by adopting a low temperature vacuum sputtering method.

Optionally, a size of the meshes of the filter net is smaller than or equal to 30 μm.

Optionally, the step of forming the filter net comprises:

disposing the photoresist on the adhesive surface of the dissociable adhesive tape;

adopting the photolithography method to etch the photoresist to form the filter net; and heating the filter net formed by etching to cure the same.

Optionally, the step of forming the filter net comprises:

disposing the photoresist on the adhesive surface of the dissociable adhesive tape;

adopting the nano-impressing method to impress the photoresist to form the filter net; and heating the filter net formed by etching to cure the same.

According to another aspect of the present invention, there is provided an MEMS sensor. The sensor comprises an external packaging structure defined by a substrate and a shell, and an MEMS chip disposed in the external packaging structure, wherein the external packaging structure has collecting holes for communicating the MEMS chip with an external space, and the collecting holes are provided with the filter net obtained using the above mentioned method.

The inventors of the present invention have found that in the prior art, as the MEMS sensing devices are miniaturized, the existing method for disposing the filter net is poor in effect and cannot meet the production requirements. Thus, the technical task to be realized by the present invention or the technical problem to be solved is not contemplated or predicted by those skilled in the art, so the present invention is a new technical solution.

Other features and advantages of the present invention will become clear according to the detailed description of exemplary embodiments of the present invention with reference to the accompanying drawings.

BRIEF DESCRIPTION OF THE FIGURES

The figures incorporated in the description and forming a part of the description illustrate the embodiments of the present invention and used to explain the principle of the present invention along therewith.

In the figures: 11: filter net; 12: thermally dissociable adhesive tape; 13: base material; 14: film; 15: self-adhesive coiled material; 16: collecting holes; 17: printed circuit board (PCB); 18: MEMS chip; 19: shell; 20 ASIC chip; 21: bonding lead.

DETAILED DESCRIPTION OF VARIOUS EMBODIMENTS

Various exemplary embodiments of the present invention will be described in detail with reference to the accompanying drawings. It should be noted that unless stated specifically otherwise, the relative arrangement of the components and steps illustrated in these embodiments, the numeral expressions and the values do not limit the scope of the present invention.

The description of at least one exemplary embodiment of the present invention is actually merely illustrative rather than limiting the present invention and the application or use thereof.

Technologies, methods and devices known to those skilled in the art may not be described in detail, but when appropriate, the technologies, methods and devices shall be regarded as a part of the description.

Any particular value in all examples illustrated and described here shall be construed as merely illustrative rather than limiting. Thus, other examples of the exemplary embodiments may have different values.

It should be noted that similar signs and letters represent similar items in the following figures, and thus, once a certain item is defined in a figure, there is no need to further describe the same in the following figures.

Figure 1:
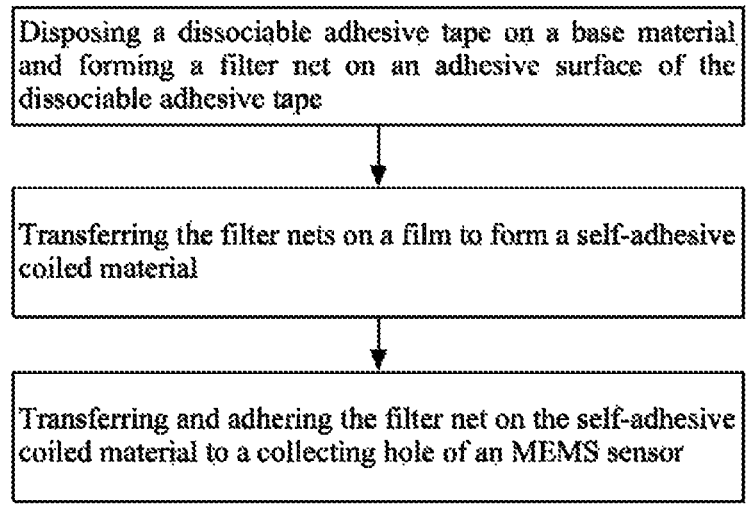
FIG. 1 is a flowchart of a method for forming a filter net of an embodiment of the present invention.

In order to solve at least one of the technical problems mentioned above, the present invention provides a method for forming a filter net 11 on an MEMS sensor. As shown in FIG. 1, the method comprises the following steps.

Figure 2:
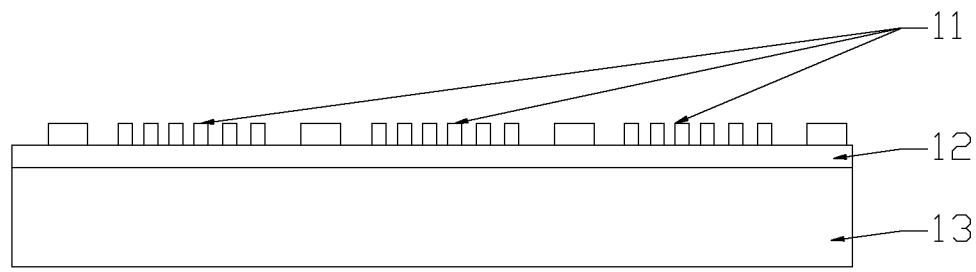
FIGS. 2-4 are schematic diagrams of a method for forming a filter net of an embodiment of the present invention.

A dissociable adhesive tape is disposed on a base material 13, and filter net 11 is formed on an adhesive surface of the dissociable adhesive tape. As shown in FIG. 2, the base material 13 may be but is not limited to a wafer or glass, and it should be guaranteed that a surface for carrying should have a set flatness to ensure the flatness of the filter net 11. The dissociable adhesive tape refers to an adhesive tape that can be dissociated under set conditions, such that the filter net 11 can be transferred to other elements. For example, a thermally dissociable adhesive tape 12 may be dissociated under a heating condition. A structural material needs to have sufficient strength to ensure that the filter net 11 has blowing resistance capacity. In a manufacturing process, an MEMS chip 18, a PCB 17 and the like will inevitably accumulate dust, water and the like. In a packaging process, the dust, water, and the like need to be blown off at first, and then gas can enter the collecting holes 16. Therefore, the filter net 11 is required to have sufficient blowing resistance capacity to avoid damages in a blowing process. A structural material for forming the filter net 11 may be but is not limited to metal, ceramic or a high polymer material.

Preferably, meshes of the filter net 11 are formed by adopting a photolithography method or nano-impressing method. The method mentioned above has the characteristics of convenience in operation and good molding quality, and the meshes of the formed filter net 11 are fine and uniform. In order to achieve better dustproof and waterproof effects, preferably, a size of the meshes of the filter net 11 is smaller than or equal to 30 μm, the meshes of such a size can block entering of the dust and water more effectively, and the filter net 11 are enabled to have sufficient structural strength.

Figure 3:
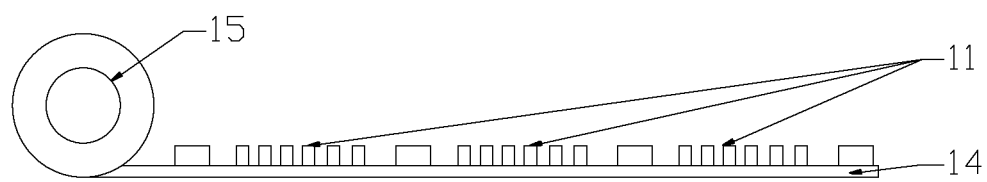

The filter net 11 are transferred on a film 14 to form a self-adhesive coiled material 15. As shown in FIG. 3, in this step, an adhesive force between the filter net 11 and the thermally dissociable adhesive tape 12 is reduced by heating, such that it is convenient to transfer the filter net to the film 14 and make the film 14 into the self-adhesive material 15. In use, only the filter net 11 on the self-adhesive tape needs to be adhered to a set position.

Figure 4:
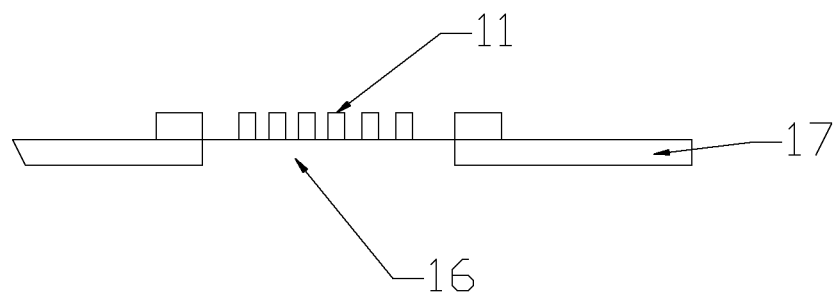

The filter net 11 located on the self-adhesive coiled material 15 is transferred and adhered to the collecting holes 16 of the MEMS sensor. As shown in FIG. 4, in such a step, at first, the peripheries of the collecting holes 16 are smeared by an adhesion agent, and an adhesive force between the adhesion agent and the filter net 11 is larger than a binding force between the filter net 11 and the film 14; and then the film 14 is uncovered to transfer and adhere the filter net 11 to the collecting holes 16. According to actual needs, the filter net 11 may be adhered to inner sides or outer sides of the collecting holes 16.

The filter net 11 formed by the method has fine and uniform meshes and high yield.

In addition, the method is suitable for large-scale and industrialized production.

There are many methods for forming the filter net 11 on the adhesive surface of the adhesive tape.

Figure 6:
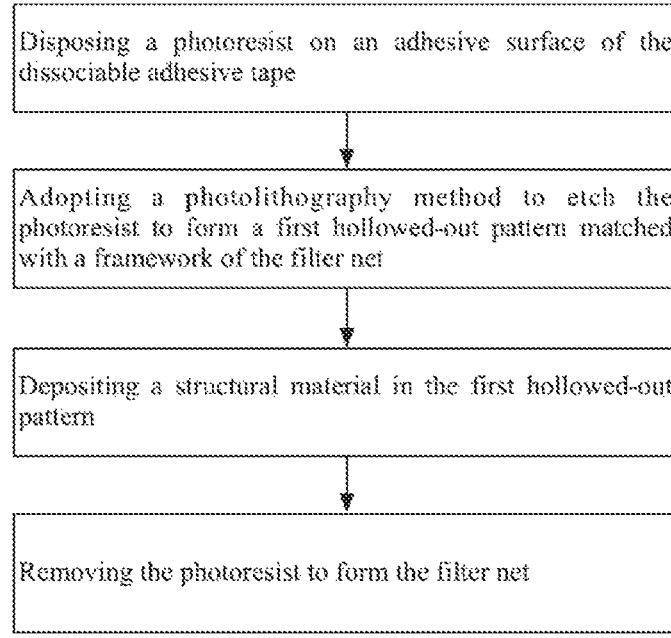
FIG. 6 is a flowchart of a first method for forming a filter net on an adhesive surface of a thermally dissociable adhesive tape of an embodiment of the present invention.

FIG. 6 shows a method for forming the filter net 11 on an adhesive surface of the thermally dissociable adhesive tape 12 of an embodiment of the present invention, which comprises the following steps.

A photoresist is disposed on the adhesive surface of the thermally dissociable adhesive tape 12. Under set light conditions, the photoresist is cured so as to be conveniently etched in subsequent steps.

The photolithography method is adopted to etch the photoresist to form a first hollowed-out pattern matched with frameworks of the filter net 11. In this step, a region blocked by a light shield is a mesh forming region, and a corroded region is the first hollowed-out pattern. The photolithography method has the characteristic of high forming precision.

A structural material is deposited in the first hollowed-out pattern to form the filter net 11. In this step, the structural material is deposited by adopting a low temperature vacuum sputtering method. The structural material filled into the first hollowed-out pattern forms a network structure, namely, the frameworks of the filter net 11. The structural material will not be deposited in the region occupied by the photoresist, and when the photoresist is removed, the meshes of the filter net 11 are formed. Optionally, the structural material is metal, $SiO_2$, or the like, to ensure sufficient structural strength of the filter net 11.

Preferably, the structural material is deposited by adopting the low temperature vacuum sputtering method. This method can ensure a uniform structure of the deposited structural material.

The photoresist is removed to form the filter net 11. In this step, after the photoresist is removed, a position where the photoresist occupies originally forms the meshes.

Next, the formed filter net 11 is transferred to the film 14 as standby. In this step, the thermally dissociable adhesive tape 12 and the filter net 11 are dissociated by a heating method, such that the filter net 11 is transferred to the film 14.

This method can form the fine filter net 11. Besides, the filter 11 is integrally formed, and the structural material of the filter net 11 is not damaged in a manufacturing process, thereby ensuring sufficient structural strength of the filter net 11.

Figure 7:
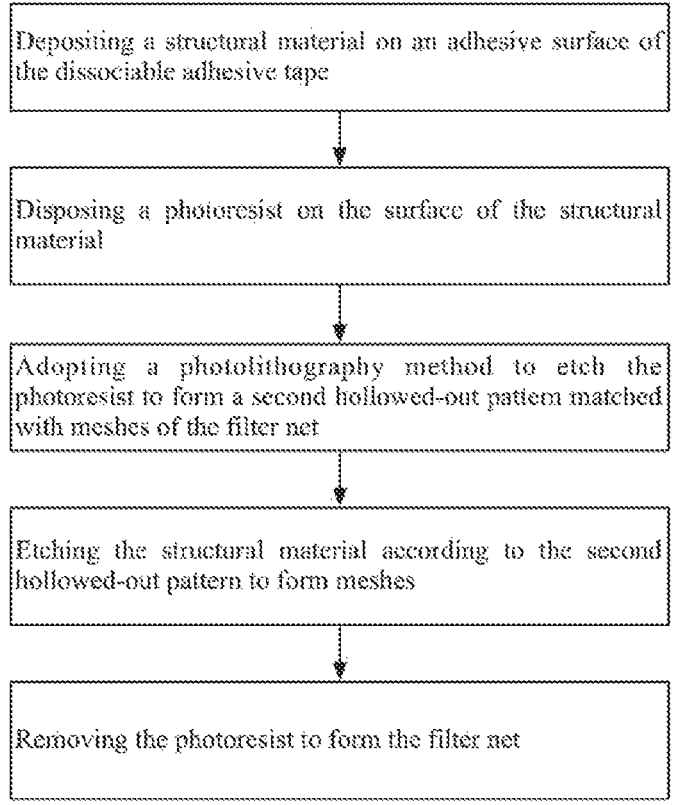
FIG. 7 is a flowchart of a second method for forming a filter net on an adhesive surface of a thermally dissociable adhesive tape of an embodiment of the present invention.

FIG. 7 shows a second method for forming the filter net 11 on the adhesive surface of the thermally dissociable adhesive tape 12 of an embodiment of the present invention, which comprises the following steps.

A structural material is deposited on the adhesive surface of the dissociable adhesive tape 12. For example, the structural material is deposited by adopting a low temperature vacuum sputtering method to ensure uniformity of the structural material. Optionally, the structural material is metal, $SiO_2$, or the like.

A photoresist is disposed on the surface of the structural material.

The photolithography method is adopted to etch the photoresist to form a second hollowed-out pattern matched with meshes of the filter net 11. In this step, a region blocked by a light shield is the region of frameworks of the filter net 11, and a corroded part is a region where meshes are formed. The method can ensure a fine degree and uniformity of the meshes.

The structural material is etched according to the second hollowed-out pattern to form the meshes. In this step, a dry or wet etching method may be adopted to remove surplus parts of the structural material to form the meshes. The dry method for example is a particle beam etching method. The wet method for example is an etching solution etching method.

The photoresist is removed to form the filter net 11.

The method differs from the method as shown in FIG. 6 in that the structural material is deposited at first, then the photoresist is disposed, mesh patterns of the filter net 11 are formed on the photoresist, and then the meshes are formed by the etching method.

The method can form the fine and uniform meshes similarly, and can define the size of the meshes in a set range, such that better dust proof and waterproof effects are ensured.

In addition, the photoresist has set structural strength after being cured and may directly serve as a structural material of the filter net 11. Such a manner saves the use of other structural materials, reduces machining procedures, reduces machining difficulty and improves the yield.

Figure 8:
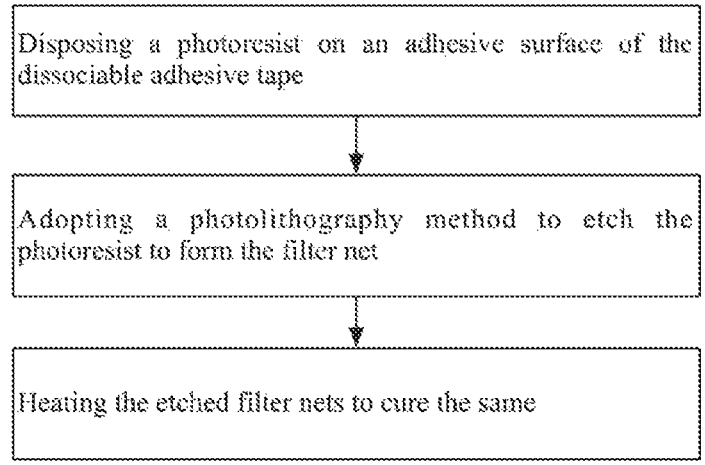
FIG. 8 is a flowchart of a third method for forming a filter net on an adhesive surface of a thermally dissociable adhesive tape of an embodiment of the present invention.

FIG. 8 shows a third method for forming the filter net 11 on an adhesive surface of the thermally dissociable adhesive tape 12 of an embodiment of the present invention, which comprises the following steps.

A photoresist is disposed on the adhesive surface of the thermally dissociable adhesive tape 12. Preferably, the structural material is a photoresist from the SU-8 or SU-8 3000 series. The photoresist is most sensitive to irradiation of a waveband of near ultraviolet 350-400 nm. The irradiation is uniform and consistent even under the irradiation condition of very thick photoresist, and perpendicular sides may be obtained. Of course, other types of photoresist may also be adopted as long as they have the performances such as good thermal stability, good etching resistance, high resolution, high depth and width, etc.

The photoresist is etched by adopting the photolithography method to form the filter net 11. In this step, the surplus structural material is etched by the photolithography method to form the meshes.

The etched filter net 11 are heated and cured, and finally the filter net 11 is formed.

Figure 9:
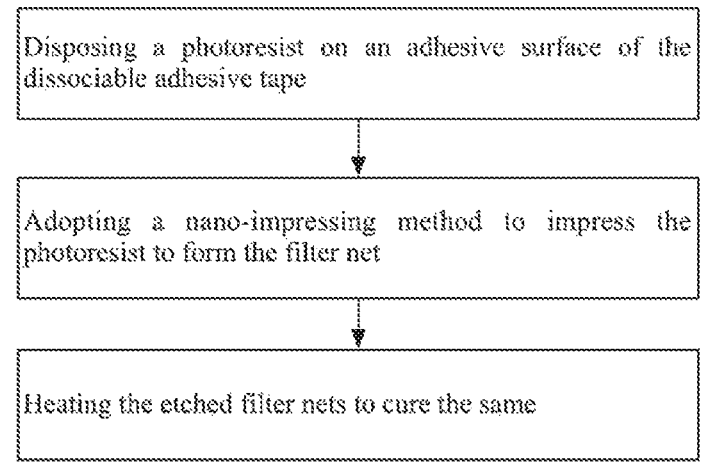
FIG. 9 is a flowchart of a fourth method for forming a filter net on an adhesive surface of a thermally dissociable adhesive tape of an embodiment of the present invention.

FIG. 9 shows a fourth method for forming the filter net 11 on an adhesive surface of the thermally dissociable adhesive tape 12 of an embodiment of the present invention, which comprises the following steps.

A photoresist is deposited on the adhesive surface of the thermally dissociable adhesive tape 12.

A nano-impressing method is adopted to impress the photoresist to form the filter net 11. In this step, the structural material is impressed by the nano-impressing method to form the meshes.

The etched filter net 11 is heated and cured, and finally the filter net 11 is formed.

Of course, the filter net 11 may be formed on the adhesive surface of the thermally dissociable adhesive tape 12 by other methods as long as requirements of the filter net 11 on the meshes and strength can be met.

In addition, the present invention further provides an MEMS sensor. The sensor may be used for sensing external environmental parameters.

The MEMS sensor comprises an external packaging structure defined by a substrate and a shell 19 and an MEMS chip 18 disposed in the external packaging structure. The MEMS chip 18 may be an MEMS microphone chip for acoustic-electrical conversion, a pressure chip for sensing pressures, a humidity chip for sensing humidity, a temperature chip for sensing temperatures, a detection chip for sensing gas varieties, or the like.

The external packaging structure has collecting holes 16 for communicating the MEMS chip 18 with an external space, and the collecting holes 16 are provided with the filter net 11 obtained by using the method provided by the present invention. The collecting holes 16 are used for collecting all kinds of environmental information, for example, temperatures, pressures, sound, humidity, gas varieties, etc.

Figure 5:
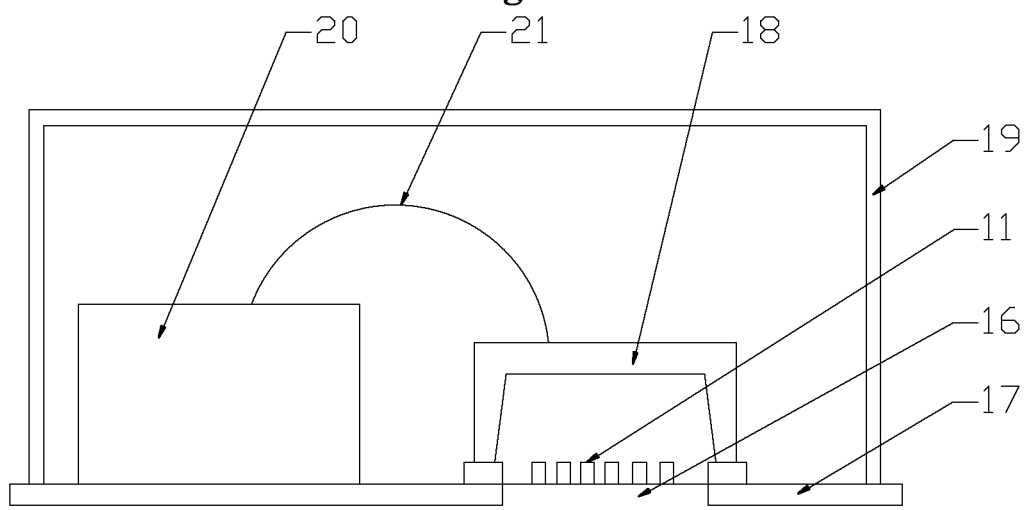
FIG. 5 is a structural schematic diagram of an MEMS sensor of an embodiment of the present invention.

In one example, as shown in FIG. 5, the sensor is an MEMS microphone. The substrate is a PCB 17, the PCB 17 is provided with collecting holes 16, and a back cavity of the MEMS chip 18 is disposed opposite to the collecting holes 16. The filter net 11 is disposed on the inner sides of the collecting holes 16, and the filter net 11 covers the collecting holes 16. The filter net 11 is formed according to the method provided by the present invention. In addition, the sensor is further provided with an ASIC chip 20, which is in signal connection with the MEMS chip 18 by a bonding lead 21. The ASIC chip 20 and the PCB 17 are also in signal connection.

Of course, the collecting holes may also be disposed in the shell (not shown) as long as environmental parameters can be provided for the MEMS chip. The filter net may also be disposed on the outer sides of the collecting holes as long as their mounting is convenient.

The MEMS sensor has the characteristics of good waterproof and dustproof effects as well as a long service life.

Although some specific embodiments of the present invention have been described in detail by way of example, it should be understood by those skilled in the art that the above examples are merely for the sake of description rather than for limiting the scope of the present invention. It should be understood by those skilled that the above embodiments may be modified without departing from the scope and spirit of the present invention. The scope of the present invention is limited by the appended claims.

What is claimed is:

1. A method for forming a filter net on an MEMS sensor, the method comprising the following steps:
   disposing a dissociable adhesive tape on a base material, and forming a filter net on an adhesive surface of the dissociable adhesive tape;
   transferring the filter net on a film to form a self-adhesive coiled material; and
   transferring and adhering the filter net on the self-adhesive coiled material to a collecting hole of the MEMS sensor.

2. The method according to claim 1, wherein meshes of the filter net are formed by adopting a photolithography method or nano-impressing method.

3. The method according to claim 1, wherein the step of forming the filter net comprises:
   disposing a photoresist on the adhesive surface of the dissociable adhesive tape;
   adopting the photolithography method to etch the photoresist to form a first hollowed-out pattern matched with frameworks of the filter net;
   depositing a structural material in the first hollowed-out pattern; and
   removing the photoresist to form the filter net.

4. The method according to claim 1, wherein the step of forming the filter net comprises:
   depositing a structural material on the adhesive surface of the dissociable adhesive tape;
   disposing a photoresist on the surface of the structural material;
   adopting the photolithography method to etch the photoresist to form a second hollowed-out pattern matched with the meshes of the filter net;
   etching the structural material according to the second hollowed-out pattern to form the meshes; and
   removing the photoresist to form the filter net.

5. The method according to claim 4, wherein the structural material forming the filter net is metal, ceramic or a high polymer material.

6. The method according to claim 4, wherein the structural material is deposited by adopting a low temperature vacuum sputtering method.

7. The method according to claim 1, wherein a size of the meshes of the filter net is smaller than or equal to 30 μm.

8. The method according to claim 1, wherein the step of forming the filter net comprises:
   disposing the photoresist on the adhesive surface of the dissociable adhesive tape;
   adopting the photolithography method to etch the photoresist to form the filter net; and
   heating the filter net formed by etching to cure the filter net.

9. The method according to claim 1, wherein the step of forming the filter net comprises:
   disposing the photoresist on the adhesive surface of the dissociable adhesive tape;
   adopting the nano-impressing method to impress the photoresist to form the filter net; and
   heating the filter net formed by etching to cure the same.

10. An MEMS sensor, comprising an external packaging structure defined by a substrate and a shell and an MEMS chip disposed in the external packaging structure, wherein the external packaging structure has collecting holes for communicating the MEMS chip with an external space, and the collecting holes are provided with the filter net obtained by using the method according to claim 1.

* * * * *